US012575020B2

(12) United States Patent
Stuewe et al.

(10) Patent No.: US 12,575,020 B2
(45) Date of Patent: Mar. 10, 2026

(54) SYSTEM FOR THERMAL MANAGEMENT OF STORAGE DEVICES

(71) Applicant: Dell Products L.P., Round Rock, TX (US)

(72) Inventors: John R. Stuewe, Round Rock, TX (US); Michael Albert Perks, Austin, TX (US)

(73) Assignee: Dell Products L.P., Round Rock, TX (US)

(*) Notice: Subject to any disclaimer, the term of this patent is extended or adjusted under 35 U.S.C. 154(b) by 812 days.

(21) Appl. No.: 18/048,155

(22) Filed: Oct. 20, 2022

(65) Prior Publication Data

US 2024/0138054 A1    Apr. 25, 2024
US 2024/0237190 A9    Jul. 11, 2024

(51) Int. Cl.
*H05K 1/02*      (2006.01)
*G06F 11/30*      (2006.01)
*H05K 1/14*      (2006.01)

(52) U.S. Cl.
CPC ....... *H05K 1/0212* (2013.01); *G06F 11/3058* (2013.01); *H05K 1/141* (2013.01); *H05K 2201/06* (2013.01)

(58) Field of Classification Search
CPC .................................................. H05K 1/0212
See application file for complete search history.

(56) References Cited

U.S. PATENT DOCUMENTS

| | | | | |
|---|---|---|---|---|
| 5,486,681 | A | * | 1/1996 | Dagnac ................... H05K 7/20 |
| | | | | 219/400 |
| 5,602,721 | A | | 2/1997 | Slade et al. |
| 5,761,033 | A | | 6/1998 | Wilhelm |
| 7,698,095 | B2 | | 4/2010 | Chung et al. |
| 7,701,713 | B2 | | 4/2010 | Li |
| 8,182,319 | B2 | | 5/2012 | Ong et al. |
| 8,550,702 | B2 | | 10/2013 | Campbell et al. |
| 9,129,958 | B2 | | 9/2015 | Mallik et al. |
| 9,237,671 | B2 | | 1/2016 | Chen et al. |
| 9,820,411 | B2 | | 11/2017 | Alshinnawi et al. |
| 10,123,452 | B2 | | 11/2018 | Chen et al. |
| 10,177,107 | B2 | | 1/2019 | Camarota |
| 10,274,945 | B2 | | 4/2019 | Arensmeier et al. |
| 10,709,032 | B1 | | 7/2020 | Holyoake et al. |
| 11,019,748 | B2 | | 5/2021 | Avvaru et al. |
| 11,064,808 | B2 | | 7/2021 | Chen et al. |
| 11,129,293 | B2 | | 9/2021 | Wurmfeld |
| 11,262,809 | B2 | | 3/2022 | Pham et al. |

(Continued)

*Primary Examiner* — John J Norton
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a data processing system may include hardware components that provide the computer implemented services. Any of the hardware components may have thermal limitations. To mitigate the impact of the thermal limitations, the data processing system may include host circuit card integrated heating assemblies. The heating assemblies may be used to warm hardware components of devices connected to the host circuit card. When connected to the host circuit card, a thermal conduction path between a device and a heating assembly may be established.

20 Claims, 11 Drawing Sheets

(56) References Cited

U.S. PATENT DOCUMENTS

| | | | |
|---|---|---|---|
| 11,293,659 B2 | 4/2022 | Brahme et al. | |
| 11,320,164 B2 | 5/2022 | Roth | |
| 2001/0040203 A1 | 11/2001 | Brock et al. | |
| 2007/0128903 A1* | 6/2007 | Mori | G06K 13/085 |
| | | | 439/159 |
| 2008/0050962 A1* | 2/2008 | Chen | H01R 13/631 |
| | | | 439/358 |
| 2011/0051342 A1* | 3/2011 | Crippen | H01R 12/83 |
| | | | 439/59 |
| 2011/0100668 A1 | 5/2011 | Syed | |
| 2011/0228473 A1 | 9/2011 | Anderson et al. | |
| 2012/0229971 A1 | 9/2012 | Mills et al. | |
| 2014/0027435 A1* | 1/2014 | Chou | H01L 23/345 |
| | | | 219/209 |
| 2014/0334084 A1 | 11/2014 | Fricker | |
| 2015/0177750 A1 | 6/2015 | Bailey et al. | |
| 2015/0180234 A1 | 6/2015 | Bailey et al. | |
| 2015/0289405 A1 | 10/2015 | Stewart et al. | |
| 2015/0359146 A1 | 12/2015 | Bailey et al. | |
| 2016/0044819 A1 | 2/2016 | Bailey et al. | |
| 2017/0071056 A1* | 3/2017 | Stoev | G11C 7/04 |
| 2017/0177007 A1 | 6/2017 | Shelnutt et al. | |
| 2017/0181329 A1 | 6/2017 | Shelnutt et al. | |
| 2018/0011522 A1 | 1/2018 | Shirakami et al. | |
| 2022/0104380 A1 | 3/2022 | Hattangadi et al. | |
| 2022/0124907 A1* | 4/2022 | Morita | H05K 1/0212 |
| 2022/0200250 A1 | 6/2022 | Brooks et al. | |
| 2022/0413573 A1* | 12/2022 | Chiu | G06F 1/20 |

* cited by examiner

Heating
Assembly
163

Edge
Connector
Receptacle
162

Heat Transfer
Layer 168

Mounting
Element 167

Host
Circuit
Card 160

Heating
Element 164

Heating
Element 164

Temperature
Sensor 166

Heating
Element 164

Edge
Connector
Receptacle
162

Heating
Element 164

Temperature
Sensor 166

Mounting
Element 167

Heat Transfer
Layer 168

Host Circuit
Card 160

Storage
Device
105

Edge
Connector
Receptacle
162

Host Circuit
Card 160

Storage Device 105

Edge Connector Receptacle 162

Host Circuit Card 160

SYSTEM FOR THERMAL MANAGEMENT OF STORAGE DEVICES

FIELD OF THE EMBODIMENTS

Embodiments disclosed herein relate generally to device management. More particularly, embodiments disclosed herein relate to systems and methods for retaining temperatures of components within temperature ranges.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
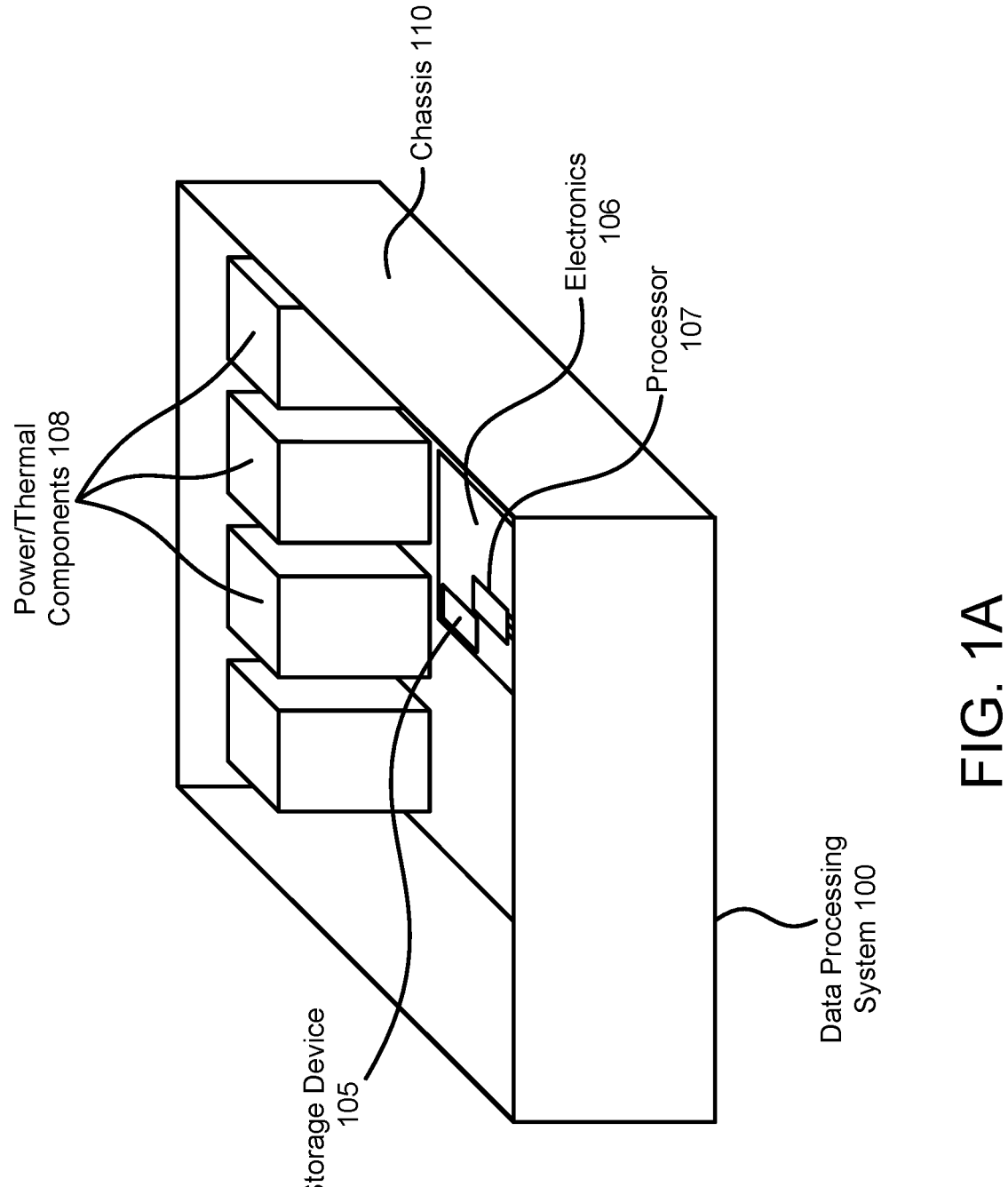
FIG. 1A shows a diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices. In the context of mechanical device, "adapted to" may mean that the mechanical device is designed to perform a particular function and may include a shape, size, structure, components thereof, etc. to accomplish the function.

In general, embodiments disclosed herein relate to methods, systems, and devices for providing computer implemented services. The computer implemented services may include any quantity and type of such services.

To provide the computer implemented services, a data processing system may be utilized. The data processing system may include hardware components that provide the computer implemented services.

Any of the hardware components may have thermal limitations such as thermal operating ranges and/or dynamic temperature ranges. To improve the likelihood of being able to provide the computer implemented services, the data processing system may include heating assemblies used to warm the hardware components to retain their temperatures within corresponding the thermal limitations.

The heating assemblies may be integrated with host circuit cards to which various hardware components may be removably attached. For example, a host circuit card may facilitate connection of various devices to it to modify the quantity and/or type of computing resources available for use. The heating assemblies may be positioned to establish a thermal conduction path to hardware components of the devices while the devices are secured to the host circuit card.

By doing so, embodiments disclosed herein may provide a data processing system capable of operating under a wider array of environment conditions by mitigating (e.g., reducing, limiting, etc.) the impact of environmental conditions in which the data processing system resides. Thus, embodiments disclosed herein may address the technical problem of operating condition limitations (e.g., thermal, and in particular cold weather) of data processing systems and hardware components thereof. The disclosed embodiments may address this problem by providing a data processing system having host circuit card integrated heating assemblies which establish thermal conductions paths to devices that may need to be warmed to retain them within thermal limitations. Accordingly, the impact of cooler ambient temperatures on hardware components may be mitigated through active warming of the hardware components.

In an embodiment, a data processing system for providing computer implemented services is provided. The data processing system may include a storage device comprising: an edge connector, and a hardware component for storing data; a host circuit card; an edge connector receptacle positioned on the host circuit card and adapted to reversibly receive the storage device; and a heating assembly positioned on the host circuit card and with the edge connector to be between the host circuit card and the storage device while the edge connector is connected to the edge connector receptacle, the heating assembly being adapted to: monitor a temperature of the hardware component, and selectively generate heat to warm the hardware component substantially by conduction heating.

The heating assembly may include a heating element adapted to selectively generate the heat.

The heating assembly may also include a temperature sensor to monitor the temperature of the hardware component.

The heating assembly may further include a heat transfer layer, positioned, at least in part, on the heating element, the heat transfer layer comprising a thermally conductive and compliant material that conforms a shape of the heat transfer layer to a shape of the storage device.

Connecting the edge connector to the edge connector may include an approach of the edge connector along a straight path toward the edge connector receptacle until electrodes of the edge connector are seated with complementary electrodes of the edge connector; and a rotation of the storage device about the edge connector, the rotation placing the storage device in contact with the heat transfer layer.

The storage device may also include a circuit card, the edge connector and the hardware component being positioned with the circuit card.

While the edge connector is connected to the edge connector receptacle, the host circuit card may be positioned a distance away from the circuit card, and the circuit card and the host circuit card are positioned in substantially parallel planes separated by the distance.

While the edge connector is connected to the edge connector receptacle: the hardware component may be positioned on a first surface on a first side of the circuit card, a second surface on a second side of the circuit card is proximate to the heating assembly, and the first side is opposite to the second side.

While the edge connector is connected to the edge connector receptacle: the heating assembly may be in thermal communication with the hardware component via a conduction path that includes the circuit card.

The storage device may also include a heat management enclosure that is in contact with the heating assembly while the edge connector is connected to the edge connector receptacle.

The data processing system may also include a processor operably connected to the edge connector receptacle. While the edge connector is connected to the edge connector receptacle, the storage device may be operably connected to the processor.

The processor may be adapted to access data stored in the hardware component when providing at least a portion of the computer implemented services.

The data processing system may also include a second edge connector receptacle positioned on the host circuit card and adapted to reversibly receive the storage device; and a second heating assembly positioned on the host circuit card and with the second edge connector to be between the host circuit card and the storage device while the edge connector is connected to the second edge connector receptacle.

The heating assembly and the second heating assembly may be positioned on opposite side of the host circuit card.

In an embodiment, a circuit board assembly including a host circuit card and a heating assembly as discussed above is provided.

Turning to FIG. 1A, a diagram illustrating a system in accordance with an embodiment is shown. The system may provide computer implemented services. To provide the computer implemented services, the system may include data processing system 100.

Data processing system 100 may include functionality to provide various types of computer implemented services. The computer implemented services may include any number and type of computer implemented services. The computer implemented services may include, for example, database services, data processing services, electronic communication services, and/or any other services that may be provided using one or more computing devices. Other types of computer implemented services may be provided by data processing system 100 without departing from embodiments disclosed herein.

To provide the computer implemented services, data processing system 100 may include various components such as electronics 106 and power/thermal components 108. Electronics 106 may include various types of hardware components such as processors (e.g., 107), memory modules, storage devices (e.g., 105), communications devices, and/or other types of devices. Any of these hardware components may be operably connected to one another using circuit card traces, cabling, connectors, etc.

Power/thermal components 108 may (i) provide power to any of the components of data processing systems 100 and/or (ii) thermally manage any of the components of data processing system 100. For example, power/thermal components 108 may include power supplies to provide power to the components. Likewise, power/thermal components 108 may include fans, temperature sensors, management components (e.g., thermal managers), and/or other types of devices usable to regulate the temperatures of the hardware components.

To regulate the temperatures of the hardware components, the fans may be used to generate flows of gases (e.g., air from an ambient environment, gases conditioned by a heating, ventilation/cooling system, etc., in the case of air referred to as an air flow or airflow). The flows of gases may be used to accelerate dissipation of heat from the hardware components. To do so, some of the flows of gases may pass proximately to the hardware components. The flows of gases may displace gases that have been warmed by the hardware components and replace the displaced gases with other gases that may be at a lower temperature, which may increase a rate of dissipation of heat from the hardware components.

To operate, the hardware components may consume electricity and generate heat as a byproduct. Consequently, the heat generated by operation of the hardware components may warm the hardware components.

Any of the hardware components may have limited thermal operating ranges. The thermal operating ranges may include an upper limit and a lower limit. In other words, if the hardware components are too warm or too cold, then the operation of the hardware components may be impacted. For example, if too warm or too cold, the hardware components may not operate, may be subject to errors in their operation, may be subject to damage if operated, and/or may exhibit other undesirable behaviors.

Similarly, one or more of the hardware components may have a limited dynamic temperature range. The dynamic temperature range may be the maximum range over which a hardware component will operate. For example, if a hardware component has a dynamic temperature range of 50° Celsius, then the hardware component may fail to operate as expected if a first operation is conducted while the hardware component is at −10° Celsius and then a second operation (subject to the dynamic temperature range limitation) is conducted while the hardware component is at 44° Celsius (i.e., a difference of 54° which is greater than the dynamic temperature range of 50° Celsius).

Because of these limited thermal operating ranges and other limitations, the operation (e.g., successful operation) of the hardware components may be dependent on certain conditions of the hardware components being met. These conditions may include, for example, (i) thermal conditions (e.g., retaining temperatures of the hardware components within corresponding thermal operating ranges and limit changes in the typical operating temperature ranges), (ii) power conditions (e.g., have access to certain levels of electrical power), and/or (iii) other types of conditions.

For example, consider a scenario in which data processing system 100 is located in an environment in which the ambient temperature is outside (e.g., lower than) the thermal operating range of a hardware component. The cool ambient temperature may decrease a temperature of the hardware component outside of its thermal operating range. Doing so may impair the operation of the hardware component which may, in turn, impair the operation of data processing system 100 and the computer implemented services provided by the system.

In general, embodiments disclosed herein relate to systems, methods, and devices for improving the likelihood data processing systems providing computer implemented services using hardware components. To improve the likelihood that data processing system 100 successfully provides the computer implemented services, embodiments disclosed herein may facilitate warming and cooling of hardware components.

Figure 1B:
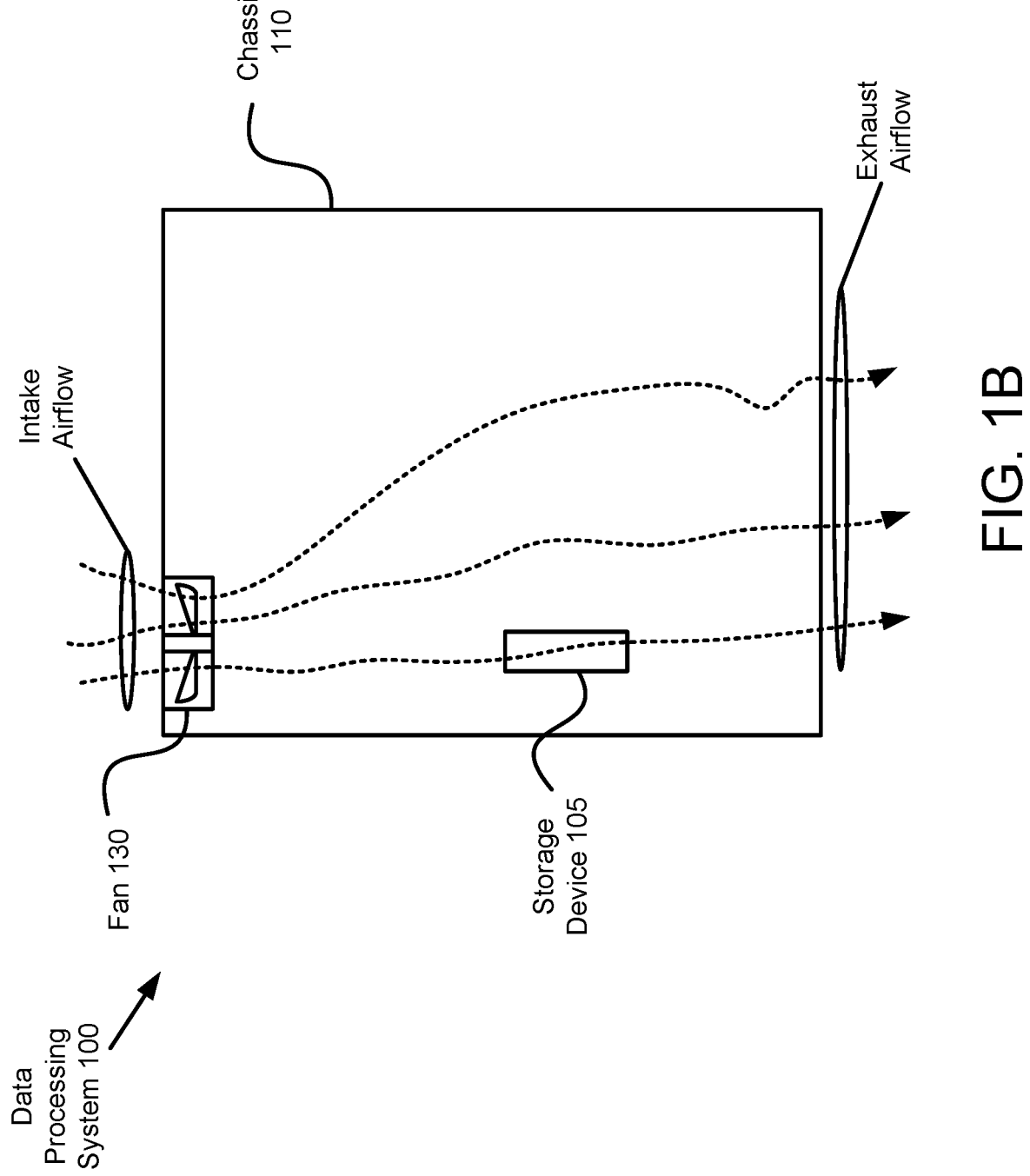
FIG. 1B shows a top view diagram illustrating gas flow in a data processing system in accordance with an embodiment.

To facilitate cooling, data processing system 100 may include fans and temperatures sensors. The temperature sensors may be used to monitor the temperatures of hardware components positioned in chassis 110. The monitored temperatures may be used to set the operation of the fans to dissipate heat thereby retaining the temperatures of the hardware components within corresponding thermal operating limits. Refer to FIG. 1B for additional details regarding flows of gas used to cool hardware components.

To facilitating warming, data processing system 100 may include heating assemblies integrated with host circuit cards to which the hardware components may be attached. For example, the host circuit cards may include heating assemblies positioned with connectors through which the hardware components may connect to the host circuit card. The heating assembly may generate heat which may be directed to a hardware component via a thermal conduction path establish when the hardware component is attached to the corresponding connector of the host circuit card. Refer to FIGS. 1C-1L for additional details regarding heating assembly integrated with host circuit cards.

By including both warming and cooling capability, a data processing system in accordance with an embodiment may be more likely to provide computer implemented services over a wider range of operating conditions. For example, when positioned in an ambient environment that is sufficiently cold to cool a hardware component below its thermal operating range, a heating assembly may warm the hardware component to keep it within its thermal operating range (and/or to limit the range over which the temperature of the hardware component ranges to retain it within a corresponding dynamic temperature range).

While illustrated in FIG. 1A with a limited number of specific components, a system may include additional, fewer, and/or different components without departing from embodiments disclosed herein.

Turning to FIG. 1B, a top view diagram of data processing system 100 in accordance with an embodiment is shown. In FIG. 1B, only a limited number of components of data processing system 100 are illustrated for conciseness. As noted above, data processing system 100 may generate a flow of gas (e.g., illustrated in FIG. 1B with dashed wavy lines terminating in arrows) that may facilitate cooling of various devices positioned within chassis 110. However, when a temperature of the gas flow is outside the thermal operating ranges of various hardware components (e.g., such as storage device 105), the operation of storage device 105 may be impaired if the gas flow reduces the temperatures of storage device 105 to be outside of its thermal operating range and/or dynamic temperature range. While described in FIG. 1B with respect to a storage device, it will be appreciated that other devices may be similarly impacted. Thus, storage device 105 may be replaced by other types of devices without departing from embodiments disclosed herein.

To provide its functionality, data processing system 100 may include fan 130 (e.g., a portion of power/thermal Components 108). Fan 130 may selectively (e.g., at different points in time, under the direction of other components) generate the flow of gas. Fan 130 may be implemented with, for example, an electrical motor, fan blades, a housing, etc.

As seen in FIG. 1B, fan 130 may draw in gases (e.g., the intake airflow) through an opening in chassis 110. The gases may traverse through the interior of chassis 110. While traversing, at least a portion of the gases may traverse proximate to storage device 105. The portion of the gases may undergo thermal exchange thereby modifying the temperatures of storage device 105. Doing so may warm the portion of the gases. The portion of the gases then be directed out of the interior of chassis 110 (e.g., as an exhaust airflow).

Chassis 110 may house various components of data processing system 100, and may include openings and/or other features for facilitating thermal management. While illustrated in FIG. 1B as having a specific form factor, chassis 110 may be of any form factor (e.g., rack mount, pedestal, etc.) without departing from embodiments disclosed herein.

To thermally manage storage device 105 and/or other components, a host circuit card may include a heating assembly to retain the temperatures of the devices/components within the thermal operating ranges and/or dynamic temperature ranges. FIGS. 1C-1L illustrate diagrams in accordance with embodiments that show features of host circuit cards and storage devices in accordance with embodiments disclosed herein.

Figure 1C:
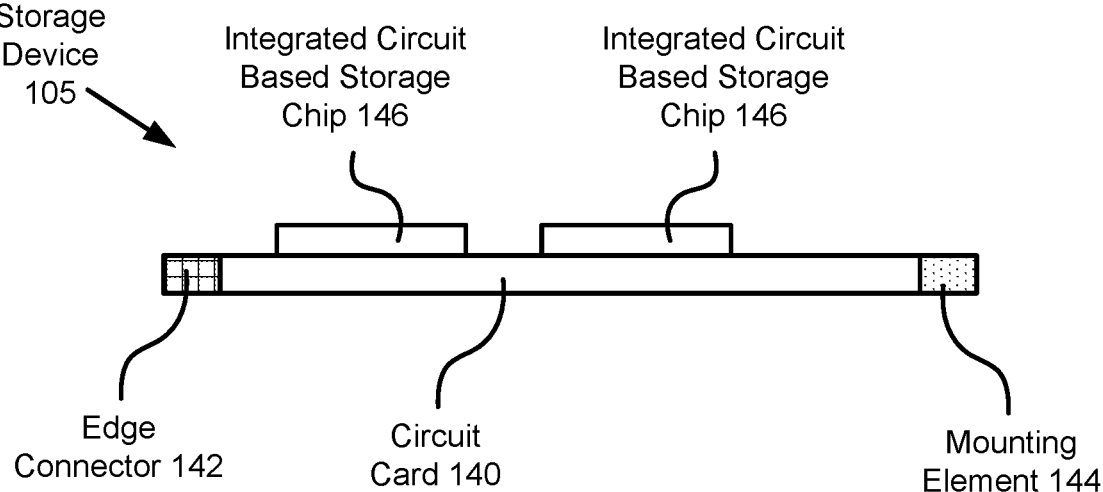
FIGS. 1C-1D show diagrams illustrating a storage device in accordance with an embodiment.

Turning to FIG. 1C, a side view diagram of storage device 105 in accordance with an embodiment is shown. Storage device 105 may be implemented with an internally mounted computer expansion card. In an embodiment, storage device 105 complies with the next generation form factor specification (also referred to as the M.2 specification).

Storage device 105 may provide data storage service. To do so, storage device 105 may include circuit card 140, edge connector 142, mounting element 144, and one or more integrated circuit based storage chips (e.g., 146). Each of these components is discussed below.

Circuit card 140 may be implemented with a circuit card (e.g., dielectric and metallization layers, any number) that include traces to establish electrical connections between various devices positioned on circuit card 140.

Edge connector 142 (drawn with cross hatched infill in FIGS. 1C, 1D, 1H, 1I, 1J, 1K, and 1L) may be implemented with traces and pads positioned on an edge of circuit card 140. The pads may be positioned in accordance with a connector specification such that insertion of edge connector 142 into a corresponding receptacle may establish electrical contacts between some of the traces of circuit card 140 and other devices accessible via the receptacle.

Mounting element 144 (drawn with dotted infill in FIGS. 1C, 1D, 1H, 1I, 1J, 1K, and 1L) may be implemented with one or more physical structures to facilitate positioning, orienting, and securing of storage device 105 to a host circuit card. For example, mounting element 144 may include a hole (or a portion thereof) through circuit card 140 and through which a fastener (e.g., bolt, pin, etc.) may be positioned to secure circuit card 140 and/or components positioned thereof with respect to a host circuit card. While edge connector 142 may provide for some attachment to a host circuit card via a receptacle, edge connector 142 may generally not limit rotation and/or translation of circuit card 140, which may result in misalignment of the pads of edge connector 142 and the complementary pads of the receptacle.

Integrated circuit based storage chip 146 may be implemented with a computer chip of any form factor. The computer chip may include solid state storage of any type including, for example, flash based storage. Other types of solid state storage may be used to implement integrated circuit based storage chip 146 without departing from embodiments disclosed herein.

While edge connector 142 is connected to a receptacle, a remote device (e.g., a processor) connected via the receptacle may store data in and retrieve stored data from integrated circuit based storage chip 146. Consequently, impairment in the operation of integrated circuit based storage chip 146 may impair the computer implemented services provided by a host device.

While described with respect to storage chips, storage device 105 may host other types of chips without departing from embodiments. For example, the chips may include controllers or other devices. Additionally, while described herein in with respect to providing storage functionality, device 105 may provide similar, different, and/or other functionalities (e.g., other than data storage) without departing from embodiments disclosed herein.

Additionally, while illustrated in the figures as being positioned on a single side of a circuit card, chips may be placed on either side of the circuit cards without departing from embodiments disclosed herein.

Generally, storage device 105 may have both a limited thermal operating range and limited dynamic temperature range. Consequently, storage device 105 may become impaired in operation if its temperature is not retained within certain limits.

While illustrated in FIG. 1C with a limited number of specific components, a storage device may include additional, fewer, and/or different components without departing from embodiments disclosed herein.

Figure 1D:
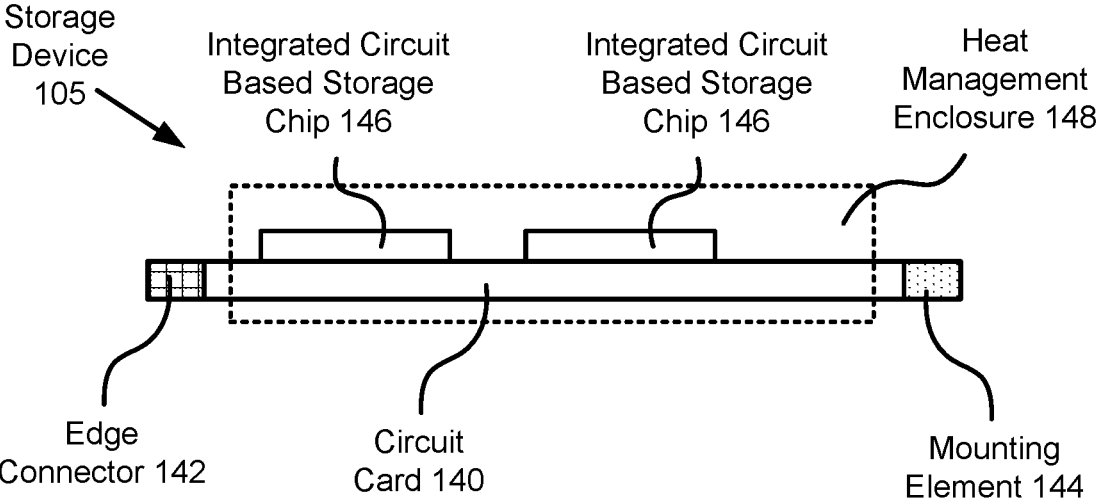

Turning to FIG. 1D, a side view diagram of storage device 105 in accordance with an embodiment is shown. In an embodiment, storage device 105 includes heat management enclosure 148. Heat management enclosure 148 may facilitate thermal exchange between integrated circuit based storage chip 146 and the ambient environment. For example, heat management enclosure 148 may be implemented with a heat spreader, a heat sink, etc. consequently, heat management enclosure 148 may have varying shapes (in FIG. 1D, heat management enclosure 148 is illustrated with dashed outlining to indicate that it may have a substantially different shape from that presented in the figure).

Heat management enclosure 148 may be implemented with a thermally conductive structure that may have a large surface area and establish thermal paths between the surface area and integrated circuit based storage chip 146.

While illustrated in FIG. 1D with a limited number of specific components, a storage device may include additional, fewer, and/or different components without departing from embodiments disclosed herein.

To manage the temperatures of storage devices as illustrated in FIGS. 1C-1D, host circuit cards may include heating assemblies to facilitate warming of the storage devices. FIGS. 1E-1L show diagrams of host circuit cards, heating assemblies, and combinations with storage devices in accordance with embodiments disclosed herein.

Figure 1E:
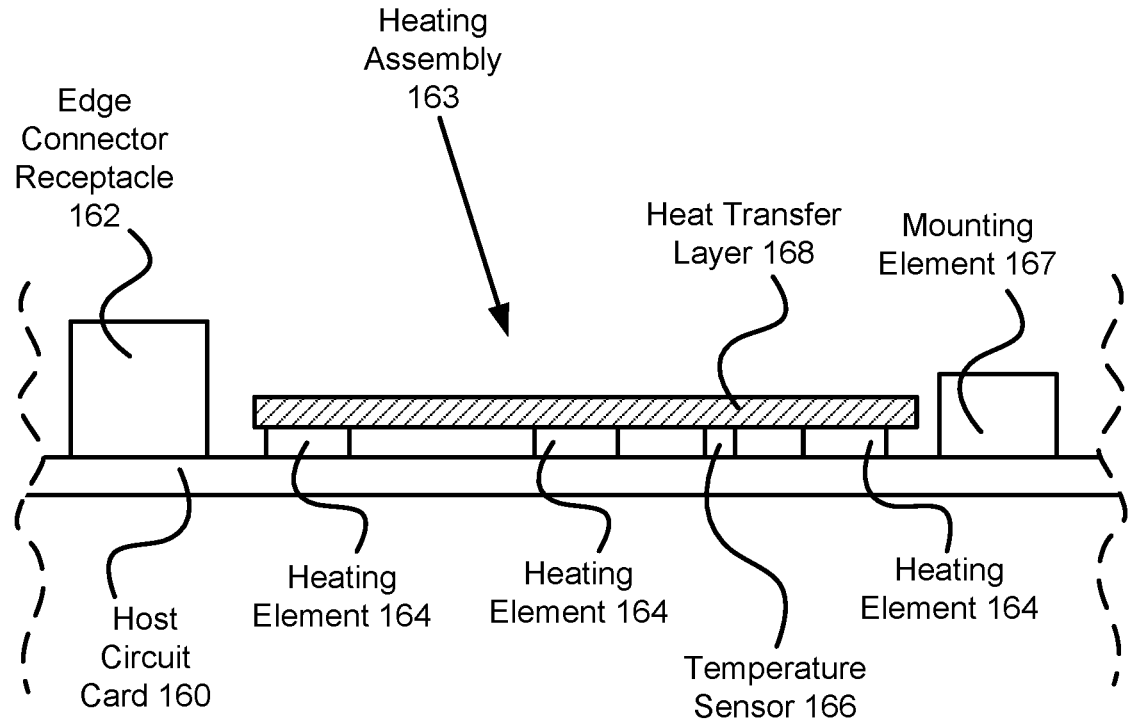
FIGS. 1E-1G show diagrams illustrating a circuit card assembly in accordance with an embodiment.
Figure 1F:
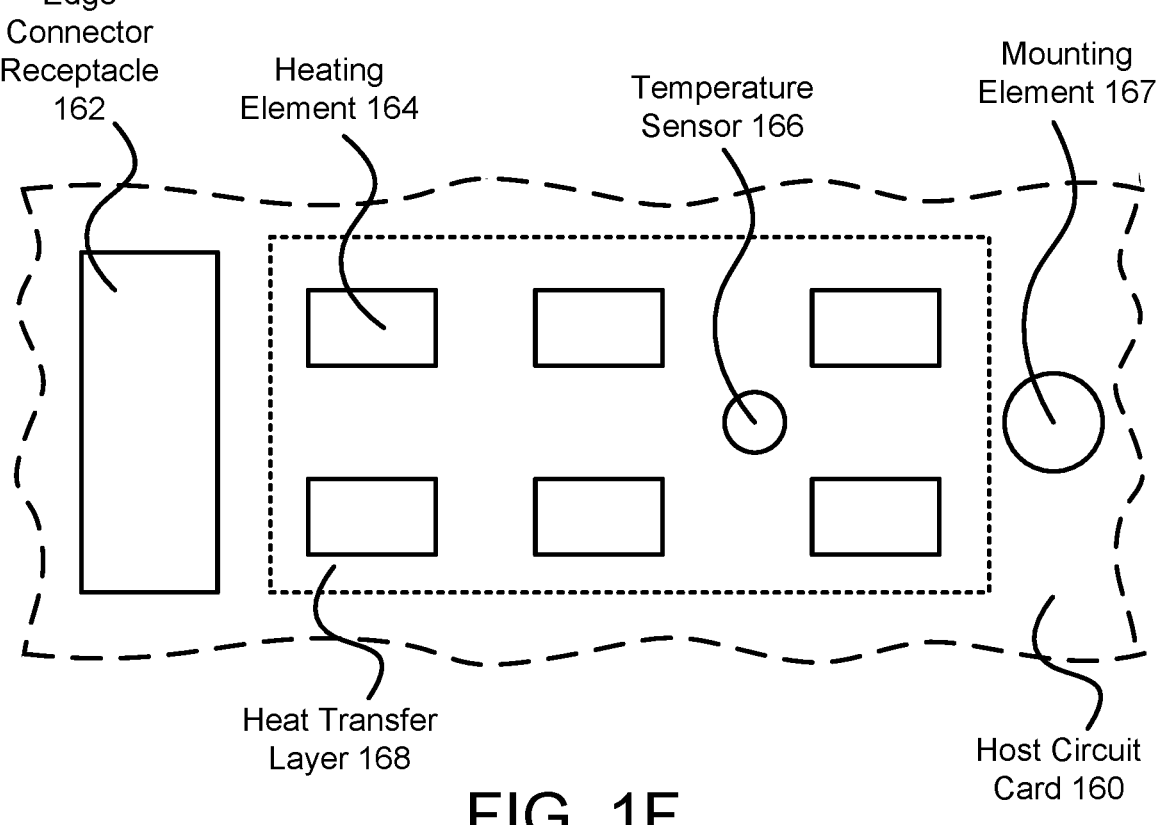

Turning to FIG. 1E, a side view diagram of host circuit card 160 in accordance with an embodiment is shown. FIG. 1F shows a top view diagram of host circuit card 160. In these figures, the wavy dashed line indicate that the structures may continue on in extent (e.g., to left and right in FIG. 1E, and on all sides in FIG. 1F). Wavy dashed lines in the remaining figures (e.g., FIGS. 1G-1L) are used similarly to indicate that the structures shown therein may continue on in extent beyond the wavy dashed lines.

Host circuit card 160 may facilitate operable connection between various devices. Host circuit card 160 may include any number of dielectric layers, metallization layers structure into traces/pads/etc., vias between the metallization layers, and/or other features. Various components may be connected directly to (e.g., solder to) or indirectly to host circuit card 160.

For example, host circuit card may include connectors for processors, memory modules, and/or other components. Likewise, host circuit card 160 may include edge connector receptacle 162. Edge connector receptacle 162 may include various complementary electrical contacts to the electrical contacts of edge connector 142. When edge connector 142 is mated to edge connector receptacle 162, electrical connections may be formed that place integrated circuit based storage chips and/or other components of storage device 105 in operably communication with other components (e.g., the processors, memory modules, etc.).

To retain storage device 105 in position, mounting element 167 may be positioned on host circuit card 160 (e.g., the spacing between edge connector receptacle 162 and mounting element 167 may correspond to the spacing between edge connector 142 and mounting element 144). Mounting element 167 may be implemented with, for example, a standoff, a threaded hole, and/or other features usable to secure a storage device to host circuit card 160.

To manage the thermal state of a device connected to edge connector receptacle 162, heating assembly 163 may be positioned between edge connector receptacle 162 and mounting element 167. Heating assembly 163 may (i) establish a thermal condition path to a device connected to edge connector receptacle 162, (ii) monitor a temperature of the device, and/or (iii) generate heat to retain a temperature of the device within a prescribed temperature range (e.g., which may be based on a thermal operating range and/or dynamic temperature range of the device). To provide its functionality, heating assembly may include any number of heating elements (e.g., 164), temperature sensors (e.g., 166), and heat transfer layers (e.g., 168. Each of these components is discussed below.

Heating element 164 may be implemented with a resistive heating device or other type of heat generating device. Heating element 164 may also include, for example, semiconductor devices usable to control the amount of current drawn through the heat generating device of heating element 164. The semiconductor devices may be operably connected to traces of host circuit card 160 through which electrical power may be maintained (e.g., the traces may be powered by power supplies or other sources, not shown). Heating element 164 may be positioned on host circuit card 160.

Temperature sensor 166 may be implemented with a sensor such as a thermocouple, a thermistor, a resistance thermometer, a silicon bandgap temperature sensor, and/or other types of temperature sensing devices that are able to sense temperatures. Temperature sensor 166 may be positioned on host circuit card 160.

Heat transfer layer 168 (drawn with lined infill in FIGS. 1E, 1G, 1H, 1J, 1K, and 1L) may establish a thermal conduction path between a device connected to edge connector receptacle 162 and both the heating elements and temperature sensors. Heat transfer layer 168 may be implemented with a layer of thermally conductive and compliant material. The compliant material may allow heat transfer layer to mold its shape to be complementary to a bottom surface of a device connected to edge connector receptacle 162. By conforming its shape to match the shape of the bottom surface of the device, a larger area for thermal transfer via conduction may be established. In an embodiment, the heat transfer layer 168 is also electrically insulating.

As seen in FIGS. 1C-1D, depending on whether storage device 105 include an enclosure, the structure of the bottom of a device connected to edge connector receptacle 162 may vary. The heat transfer layer 168 may facilitate use of heating assembly 163 with a broad range of devices having varying geometries.

As seen in FIG. 1F, heat transfer layer 168 (drawn without infill and with dashed outlining in FIGS. 1F and 1I) may cover the heating elements and temperature sensors. Consequently, when a device is positioned in edge connector receptacle 162, the device may be in thermal communication with the heating assembly and components thereof substantially through conduction heating.

While illustrated in FIGS. 1E-1F with a limited number of specific components, a host circuit card (and/or corresponding assembly which may include a heating assembly, connectors, mounting elements etc.) may include additional, fewer, and/or different components without departing from embodiments disclosed herein.

Figure 1G:
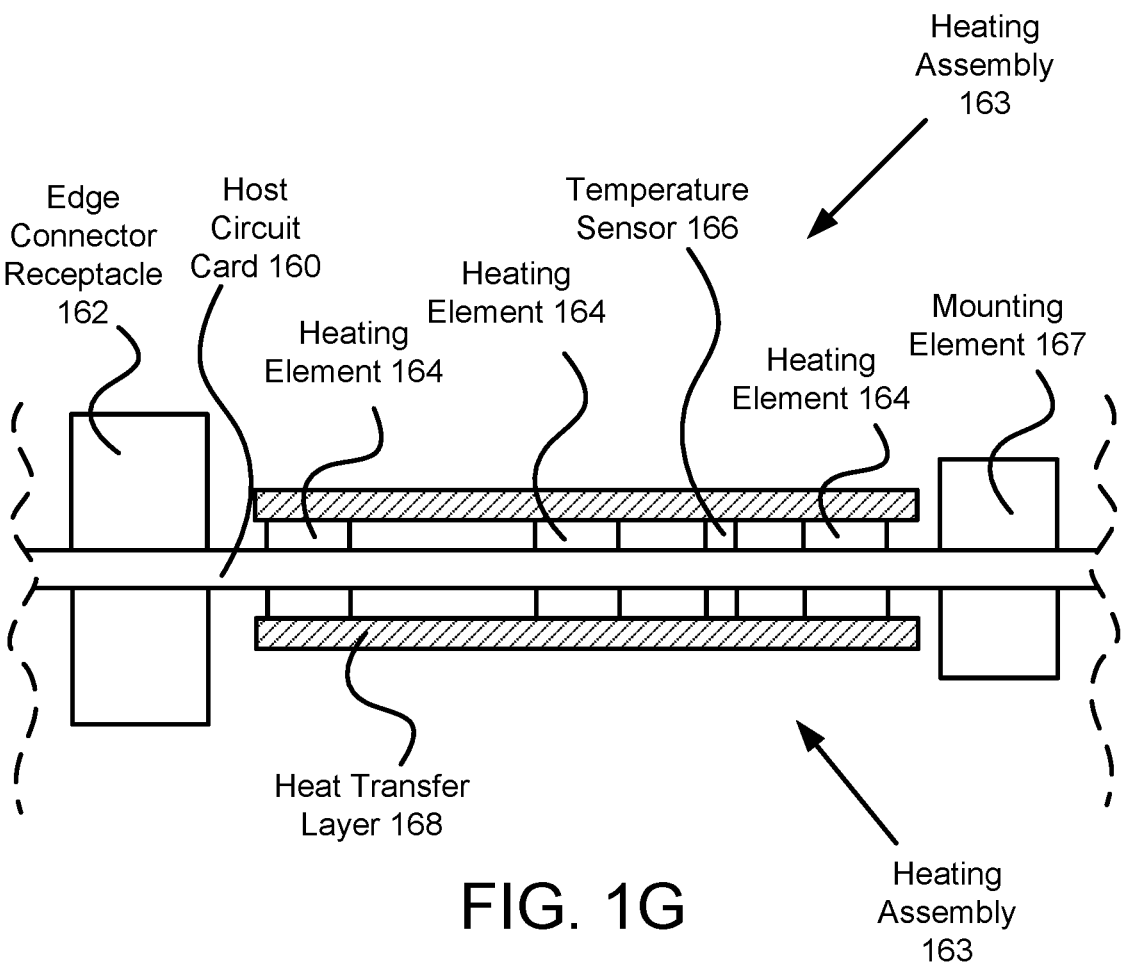

While host circuit card 160 shown in FIGS. 1E-1F with capability to receive a storage device, it will be appreciated that a host circuit card may include capability to receive multiple storage devices (and/or other types of devices that may include hardware components with various thermal limitations). Turning to FIG. 1G, a side view diagram of host circuit card 160 (and/or assembly thereof) in accordance with an embodiment is shown.

As seen in FIG. 1G, host circuit card 160 may have two sets of components to receive two different devices (e.g., two storage devices) and thermally manage the received devices. Each set may be referred to as a set of device receiving components, and each set may include a heating assembly, an edge connector receptacle, and a mounting element.

As seen in FIG. 1G, in an embodiment, the sets of device receiving components may be positioned on opposite sites of host circuit card 160. While illustrated in FIG. 1G as mirroring each other, the sets of device receiving components may be oriented and/or positioned differently from one another on different sides of edge connector receptacle 162. In this configuration, device density may be improved and reuse of certain components for thermal management components may be improved. For example, field effect transistors used to manage current flow to heating elements may be shared by the heating elements of two sets of device receiving component, thereby facilitating reduced component count and/or reduced management complexity (e.g., fewer control lines).

As noted above, host circuit cards with sets of device receiving components may receive storage devices (and/or other types of devices) that may include hardware components with thermal limits.

Figure 1H:
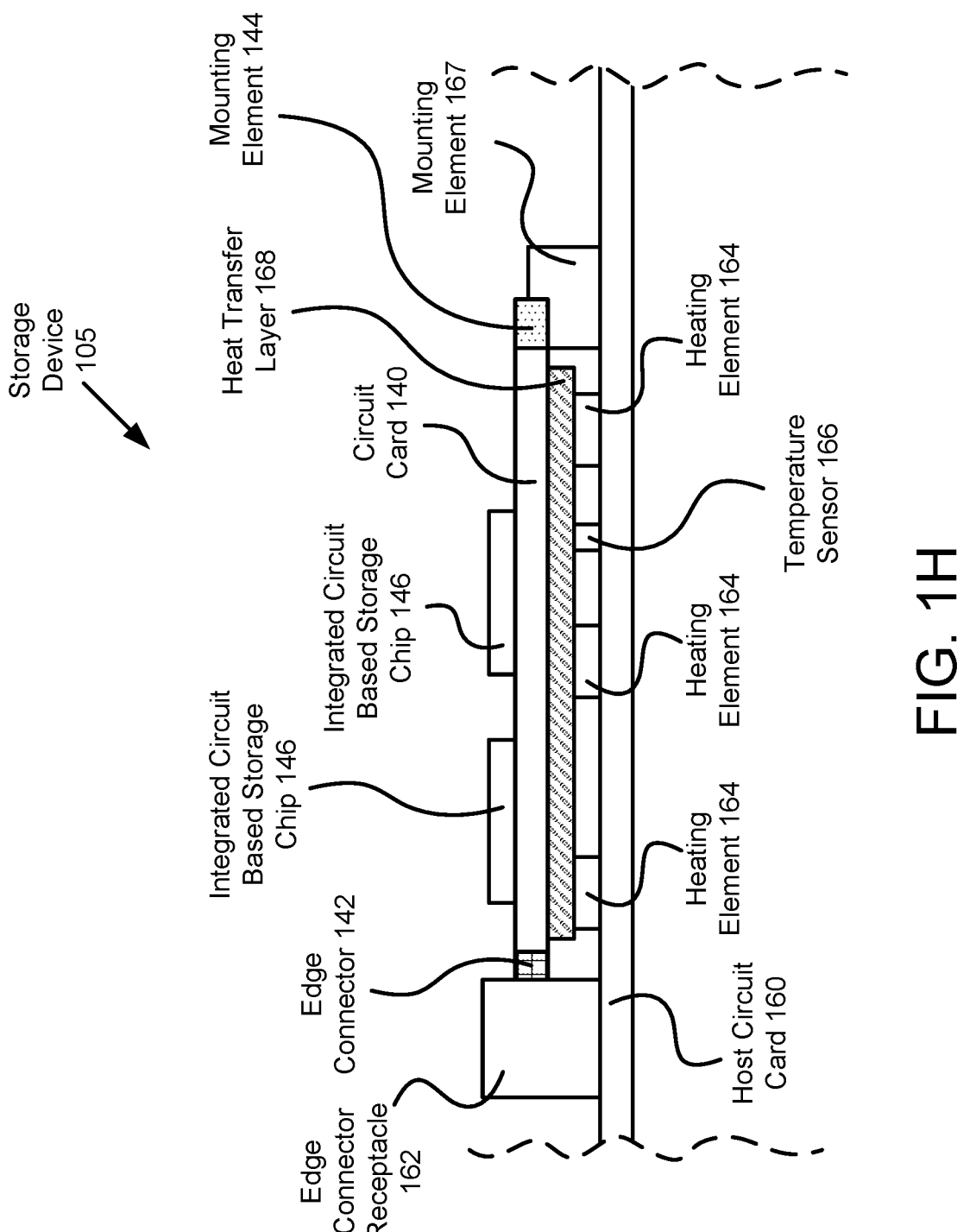
FIGS. 1H-1I show diagrams illustrating a circuit card assembly and a storage device in accordance with an embodiment.
Figure 1I:
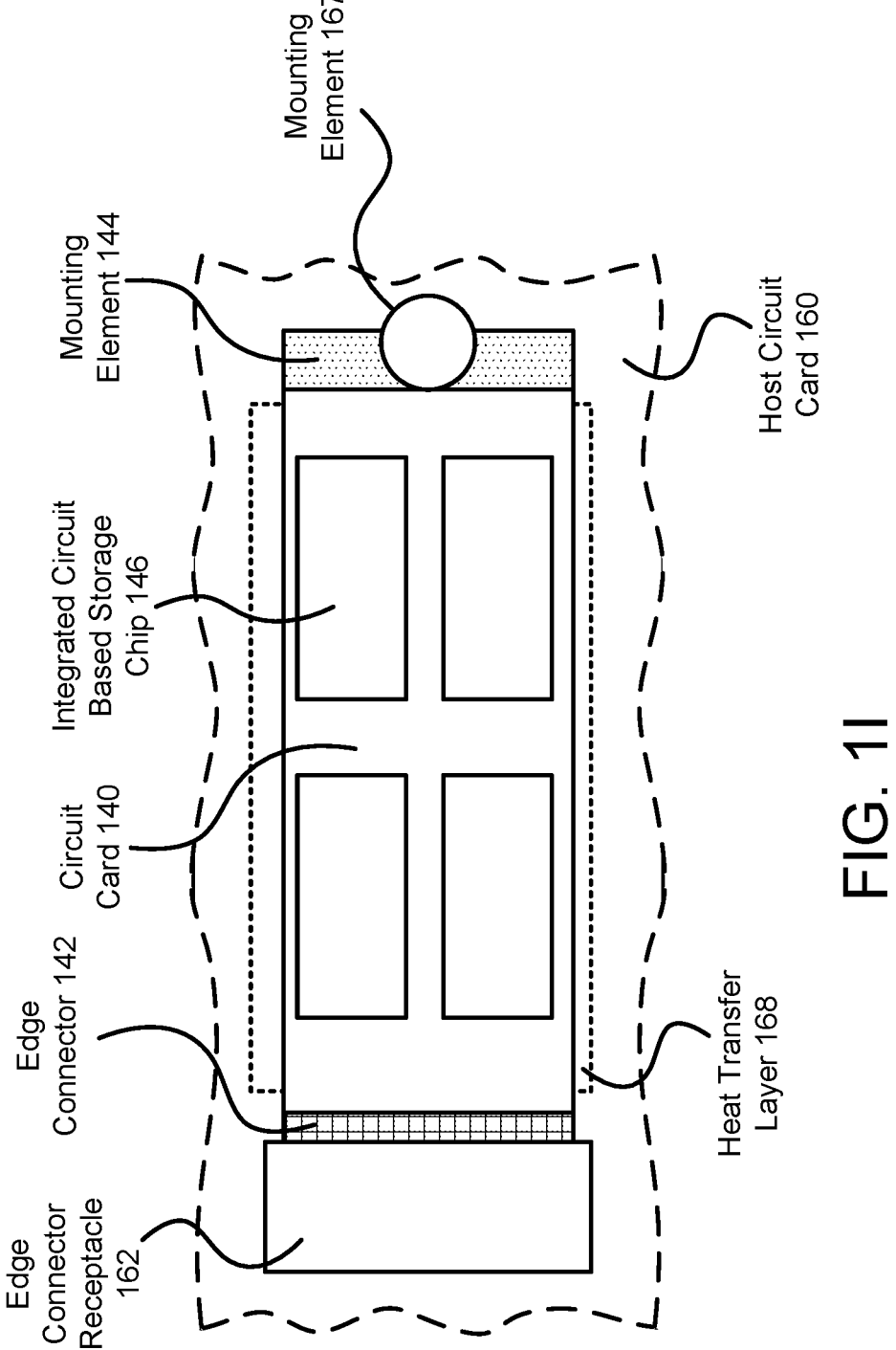

Turning to FIG. 1H, a side view diagram of host circuit card 160 and storage device 105 in accordance with an embodiment is shown. FIG. 1I shows a similar top view diagram of host circuit card 160 and storage device 105.

As seen in FIGS. 1H-1I, when storage device 105 is connected to edge connector receptacle 162, the heating elements of the heating assembly on host circuit card 160 may be in thermal communication with the storage device via a thermal conduction path through heat transfer layer 168. The heat generated by the heating elements of the heating assembly may be transferred along the thermal conduction path to warm integrated circuit based storage chip 146.

To ascertain when to operate the heating elements, temperature sensor 166 may be used to measure a temperature. While not directly in contact with the integrated circuit based storage chips, the temperature measurements provided by temperature sensor 166 may be close to the actual temperatures of the chips. Consequently, correction factors or other corrections methods may be applied to obtain accurate measurements of the temperatures of the temperature sensitive hardware components of storage device 105.

When so positioned, as seen in FIG. 1I, mounting element 144 and mounting element 167 may be aligned with one another. Consequently, a fastener may be used to secure storage device 105 to host circuit card 160 via these mounting elements.

Figure 1J:
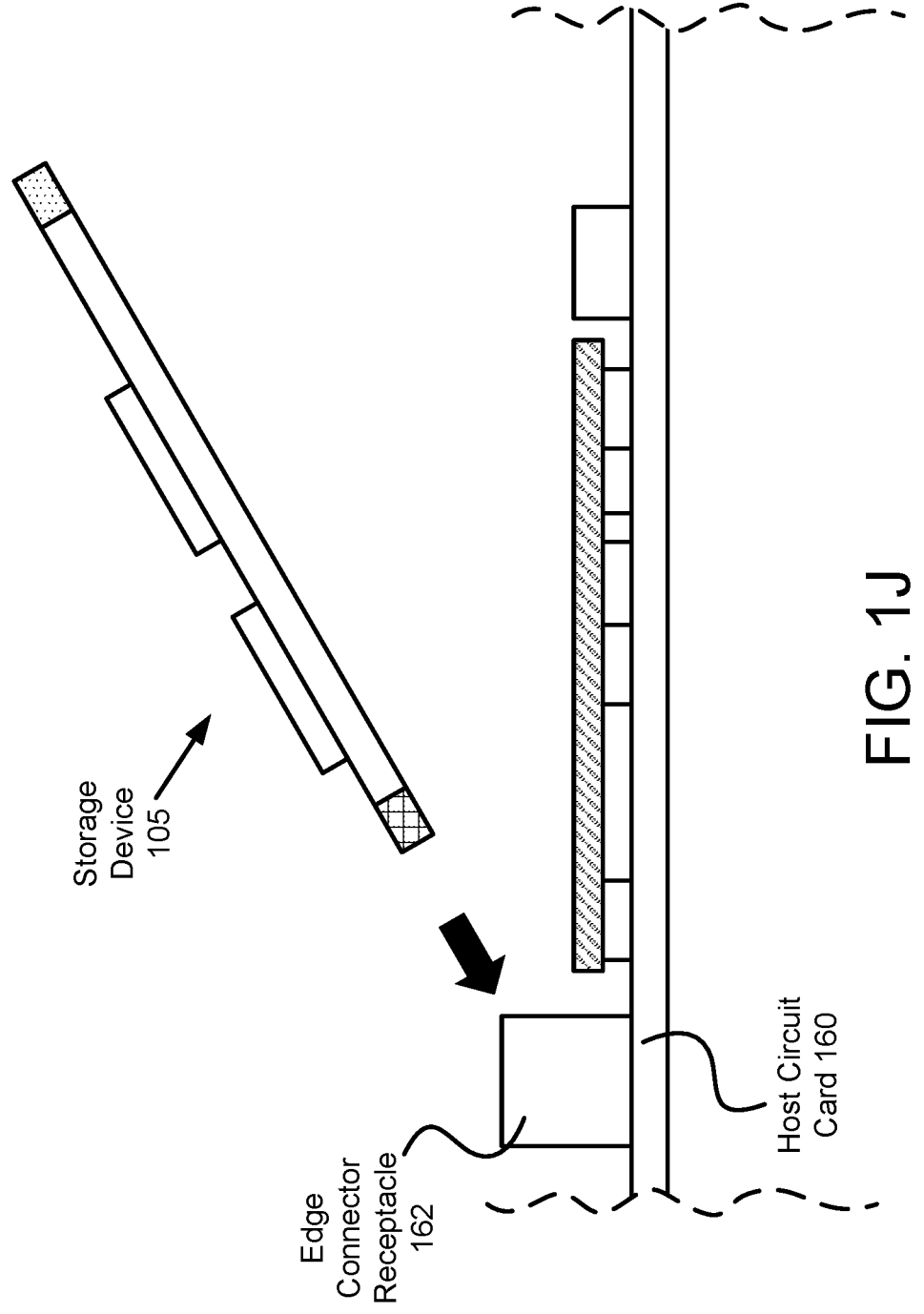
FIGS. 1J-1L show diagrams illustrating a process for securing a storage device and a circuit card assembly in accordance with an embodiment.
Figure 1K:
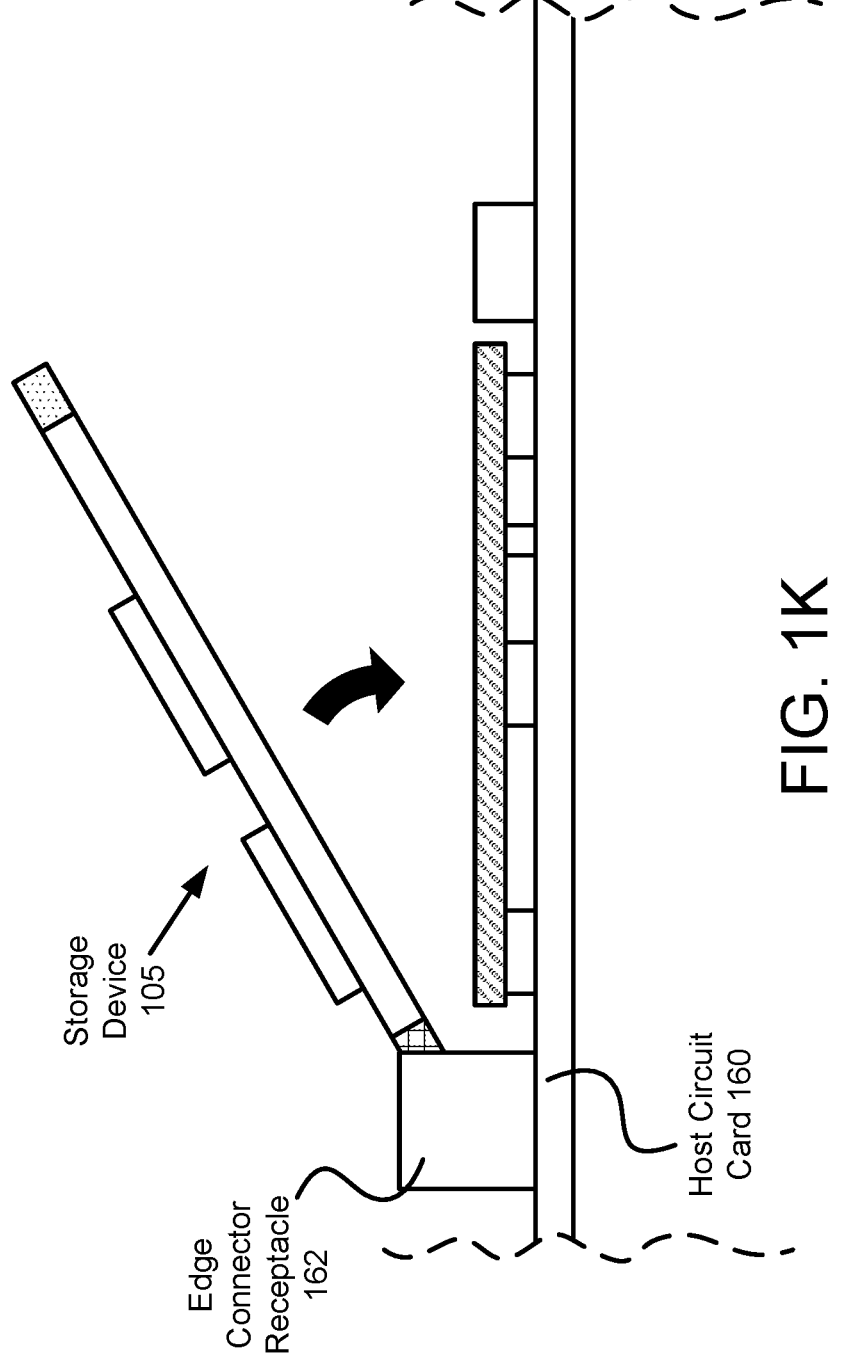
Figure 1L:
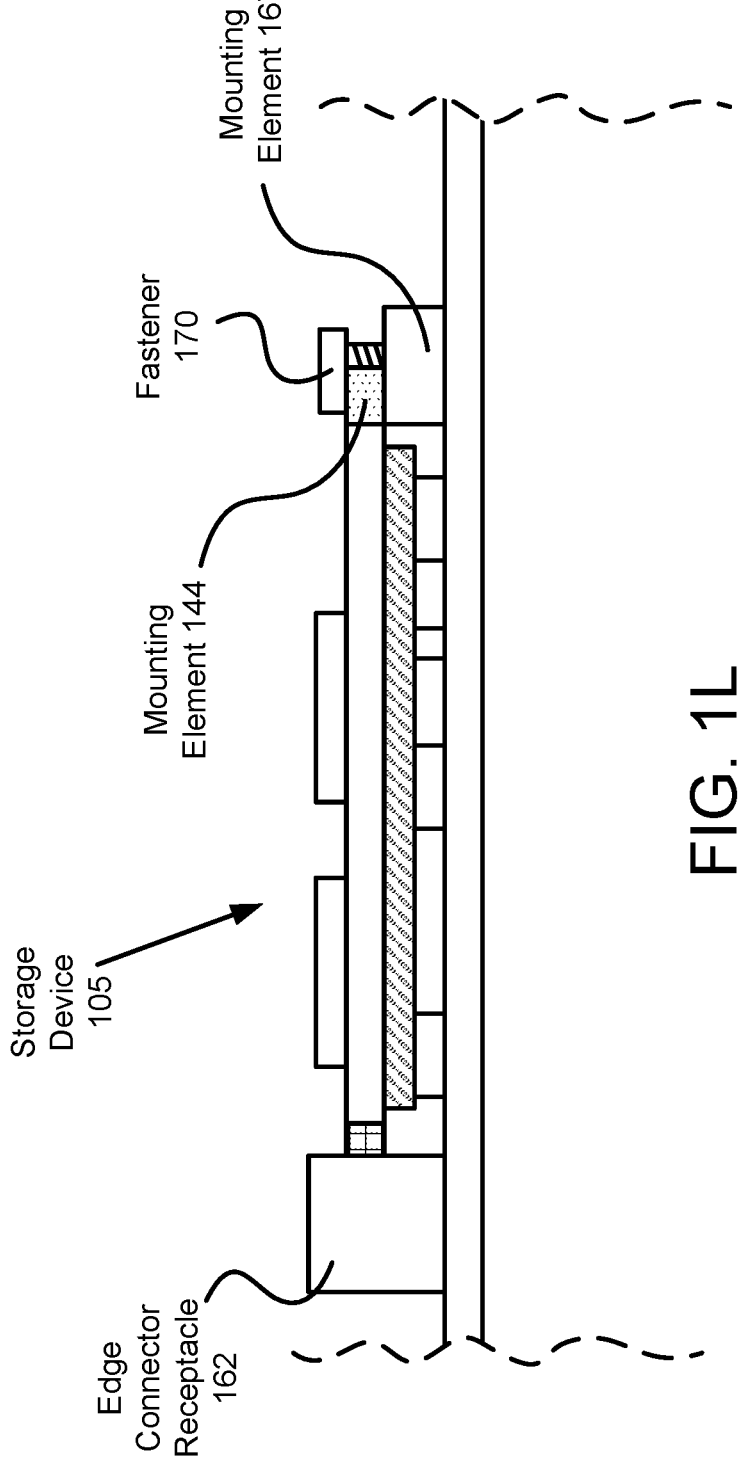

To facilitate positioning of the storage device as illustrated in FIGS. 1H-1I, the storage device may be moved/oriented and during which edge connector receptacle 162 may serve as a guide. FIGS. 1J-1L illustrate a process of positioning a storage device with host circuit card 160 in accordance with an embodiment.

Turning to FIG. 1J, a first side view diagram illustrating a first portion of a securing process in accordance with an embodiment is shown. As seen in FIG. 1J, to secure storage device 105, the edge connector of storage device 105 may be initially aligned with edge connector receptacle 162. Once aligned, storage device 105 may be moved toward edge connector receptacle until the edge connector of storage device 105 engages. In FIG. 1J, the movement is illustrated using the filled oversized arrow. The movement may be an approach of the edge connector towards the edge connector receptacle along a straight path. As seen in FIG. 1J, the circuit card of storage device 105 may lie in a plane that is not parallel to the plane in which host circuit card 160 is positioned.

Turning to FIG. 1K, a second side view diagram illustrating a second portion of a securing process in accordance with an embodiment is shown. As seen in FIG. 1K, after the edge connector of storage device 105 is engaged with edge connector receptacle 162, storage device 105 may be rotated about an axis defined by edge connector receptacle 162 (edge connector receptacle 162 may limit movement/rotation of storage device 105 while the edge connector is engaged with edge connector receptacle 162). In FIG. 1K, the rotation is illustrated using a filled oversized arrow.

The rotation of storage device 105 may position a portion of storage device on the heating assembly thereby establishing a thermal condition path. The heat transfer layer may conform its shape to the portion of the storage device (e.g., which may be a bottom portion of a circuit card, a portion of an enclosure, etc.).

Turning to FIG. 1L, a third side view diagram illustrating a second portion of a securing process in accordance with an embodiment is shown. As seen in FIG. 1L, faster 170 may be positioned with the mounting elements (e.g., 144, 166) to secure storage device 105 in place. Faster 170 may be implemented with any type of fastening devices such as, for example, a bolt, a pin, etc.

As illustrated in FIGS. 1C-1L, a data processing system in accordance with embodiments disclosed herein may include active heating capabilities to facilitate thermal regulation of storage devices positioned therein substantially through thermal condition. The heating capabilities may be used to warm the storage devices to improve the likelihood of the storage devices successfully operating. To do so, the warming may be used to retain the temperatures of the storage devices within prescribed ranges.

Figure 2:
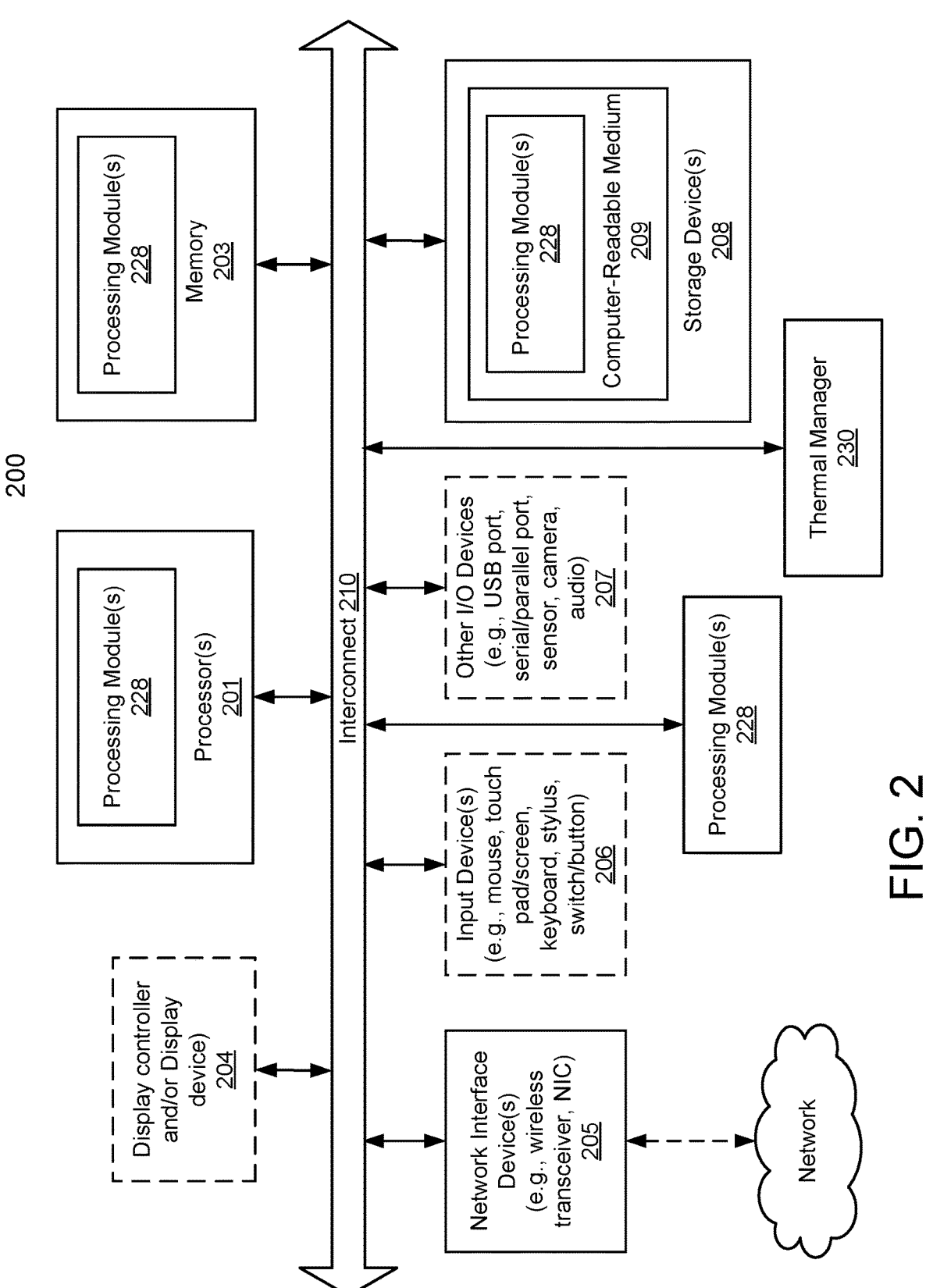
FIG. 2 shows a block diagram illustrating a computing device in accordance with an embodiment.

As discussed with respect to FIG. 1A, data processing system 100 may be implemented with a computing device. For example, a hardware component on which a heat sink may be positioned may be a part of the computing device. Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-230 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a coprocessor, an embedded processor, or any other type of logic capable of processing instructions.

Processor 201, which may be a low power multi-core processor socket such as an ultra-low voltage processor, may act as a main processing unit and central hub for commu-nication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux® Unix®, or other real-time or embedded operating systems such as VxWorks®.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a Wi-Fi® transceiver, an infrared transceiver, a Bluetooth® transceiver, a WiMax® transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Thermal manager 230 may manage the temperatures of hardware components (e.g., processor(s) 201, storage device

105, etc.). To do so, thermal manager 230 may (i) identify temperatures of the hardware components, (ii) based on the identified temperatures, use fans or other gas flow control components to establish gas flows to cool the hardware components (e.g., to bring them into and/or retain them within certain temperature ranges), (iii) based on the identified temperatures, active heating assemblies positioned with the hardware components to warm the hardware components (e.g., to bring them into and/or retain them within certain temperature ranges), and/or (iv) take proactive action (e.g., disable from operating, flag, migrate workloads away from) with respect to hardware components based on their temperatures. The temperature ranges may be set based on the thermal operating ranges and/or dynamic temperature ranges of the hardware components. For example, if the thermal operating range of a hardware component is 0-100° Celsius and a dynamic temperature range of a storage device (that may have a broader thermal operating range) is 50° Celsius, then the certain temperature range may be set for a 50° range within the 0-100° Celsius temperature range (e.g., from 0-50°, from 10-60°, etc.) and/or with some level of buffering (e.g., if a true thermal range is 0-100°, it may be treated as 5-95° if a 5° buffer is used).

Thermal manager 230 may be implemented with a programmable logic device (e.g., a complex logic device, microcontroller, etc.) and/or a static device (e.g., application specific integrated circuit). To provide its functionality, thermal manager 230 may communicate with a host management entity (e.g., an operating system executing with processor(s) 201) to implement various actions and responses based on the temperatures of hardware components (e.g., which may be self-reported and/or measured using temperature sensors).

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system for providing computer implemented services, comprising:
a storage device comprising:
an edge connector, and
a hardware component for storing data;
a host circuit card;
an edge connector receptacle positioned on the host circuit card and adapted to reversibly receive the storage device; and
a heating assembly positioned on the host circuit card and with the edge connector to be between the host circuit card and the storage device while the edge connector is connected to the edge connector receptacle, the heating assembly being adapted to:
monitor a temperature of the hardware component, and
selectively generate heat to warm the hardware component substantially by conduction heating.

2. The data processing system of claim 1, wherein the heating assembly comprises:
a heating element adapted to selectively generate the heat.

3. The data processing system of claim 2, wherein the heating assembly further comprises:
a temperature sensor to monitor the temperature of the hardware component.

4. The data processing system of claim 3, wherein the heating assembly further comprises:
a heat transfer layer, positioned, at least in part, on the heating element, the heat transfer layer comprising a thermally conductive and compliant material that conforms a shape of the heat transfer layer to a shape of the storage device.

5. The data processing system of claim 4, wherein connecting the edge connector to the edge connector receptacle comprises:
an approach of the edge connector along a straight path toward the edge connector receptacle until electrodes of the edge connector are seated with complementary electrodes of the edge connector receptacle; and
a rotation of the storage device about the edge connector, the rotation placing the storage device in contact with the heat transfer layer.

6. The data processing system of claim 1, wherein the storage device further comprises:
a circuit card, the edge connector and the hardware component being positioned with the circuit card.

7. The data processing system of claim 6, wherein while the edge connector is connected to the edge connector receptacle, the host circuit card is positioned a distance away from the circuit card, and the circuit card and the host circuit card are positioned in substantially parallel planes separated by the distance.

8. The data processing system of claim 7, wherein, while the edge connector is connected to the edge connector receptacle:
the hardware component is positioned on a first surface on a first side of the circuit card,
a second surface on a second side of the circuit card is proximate to the heating assembly, and
the first side is opposite to the second side.

9. The data processing system of claim 8, wherein, while the edge connector is connected to the edge connector receptacle:
the heating assembly is in thermal communication with the hardware component via a conduction path that comprises the circuit card.

10. The data processing system of claim 9, wherein the storage device further comprises:
a heat management enclosure that is in contact with the heating assembly while the edge connector is connected to the edge connector receptacle.

11. The data processing system of claim 1, further comprising:
a processor operably connected to the edge connector receptacle,
wherein while the edge connector is connected to the edge connector receptacle, the storage device is operably connected to the processor.

12. The data processing system of claim 11, wherein the processor is adapted to access data stored in the hardware component when providing at least a portion of the computer implemented services.

13. The data processing system of claim 1, further comprising:
a second edge connector receptacle positioned on the host circuit card and adapted to reversibly receive the storage device; and
a second heating assembly positioned on the host circuit card and with the second edge connector receptacle to be between the host circuit card and the storage device while the edge connector is connected to the second edge connector receptacle.

14. The data processing system of claim 13, wherein the heating assembly and the second heating assembly are positioned on opposite sides of the host circuit card.

15. A circuit card assembly, comprising:
a host circuit card;

an edge connector receptacle positioned on the host circuit card and adapted to reversibly receive an edge connector of a device; and a heating assembly positioned on the host circuit card and with the edge connector to be between the host circuit card and the device while the edge connector is connected to the edge connector receptacle, the heating assembly being adapted to:

monitor a temperature of the device, and selectively generate heat to warm the device substantially by conduction heating.

16. The circuit card assembly of claim 15, wherein the heating assembly comprises:

a heating element adapted to selectively generate the heat.

17. The circuit card assembly of claim 16, wherein the heating assembly further comprises:

a temperature sensor to monitor the temperature of the device.

18. The circuit card assembly of claim 17, wherein the heating assembly further comprises:

a heat transfer layer, positioned, at least in part, on the heating element, the heat transfer layer comprising a thermally conductive and compliant material that conforms a shape of the heat transfer layer to a shape of the device.

19. The circuit card assembly of claim 18, further comprising:

a second edge connector receptacle positioned on the host circuit card and adapted to reversibly receive the device; and a second heating assembly positioned on the host circuit card and with the second edge connector receptacle to be between the host circuit card and the device while the edge connector is connected to the second edge connector receptacle.

20. The circuit card assembly of claim 19, wherein the heating assembly and the second heating assembly are positioned on opposite sides of the host circuit card.

* * * * *